(12) United States Patent
Parise

(10) Patent No.: US 6,653,002 B1
(45) Date of Patent: Nov. 25, 2003

(54) QUICK CHARGE BATTERY WITH THERMAL MANAGEMENT

(76) Inventor: Ronald J. Parise, 101 Wandover Rd., Suffield, CT (US) 06078

( * ) Notice: Subject to any disclaimer, the term of this patent is extended or adjusted under 35 U.S.C. 154(b) by 0 days.

(21) Appl. No.: 09/556,576

(22) Filed: Apr. 24, 2000

Related U.S. Application Data

(63) Continuation-in-part of application No. 09/183,359, filed on Oct. 30, 1998, now Pat. No. 6,057,050, which is a continuation-in-part of application No. 08/933,664, filed on Sep. 17, 1997, now Pat. No. 5,871,859.
(60) Provisional application No. 60/046,027, filed on May 9, 1997.

(51) Int. Cl.[7] .................... H01M 14/00; H01M 8/00; H01M 6/00; H01L 35/00
(52) U.S. Cl. .................... 429/7; 429/12; 429/26; 429/120; 429/122; 136/200
(58) Field of Search .................... 429/62, 61, 63, 429/93, 92, 91, 26, 7, 24, 12, 120, 122; 136/200, 205, 230

(56) References Cited

U.S. PATENT DOCUMENTS

| 4,253,515 A | * | 3/1981 | Swiatosz .................... 165/61 |
| 5,358,799 A | * | 10/1994 | Gardner .................... 429/26 |
| 5,569,552 A | * | 10/1996 | Rao et al. .................... 429/72 |

FOREIGN PATENT DOCUMENTS

| SU | 1420318 | * | 8/1988 | ........... F25B/21/02 |
| SU | 1446341 | * | 12/1988 | ............. E21F/9/00 |
| SU | 1631628 | * | 2/1991 | .......... H01M/10/50 |

\* cited by examiner

*Primary Examiner*—Stephen Kalafut
*Assistant Examiner*—R Alejandro
(74) *Attorney, Agent, or Firm*—Alix, Yale & Ristas, LLP

(57) ABSTRACT

A quick charge battery with thermal management is described which includes a cooler preferably disposed at least partially within the battery to transfer thermal energy. The cooler may comprise a thermoelectric generator, a microcooler, a heat pipe or combinations of the above. The cooler is capable of cooling the battery and in some embodiments selectively heating the battery to a minimum temperature level. The cooler functions to cool the battery and thereby minimizes thermal build-up produced by rapid charging of the battery.

13 Claims, 15 Drawing Sheets

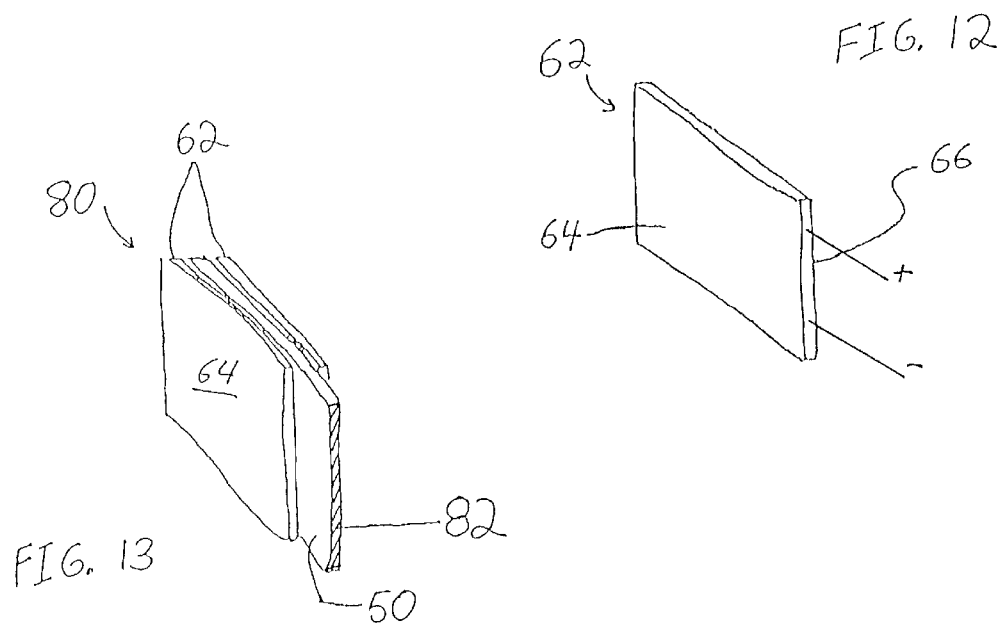
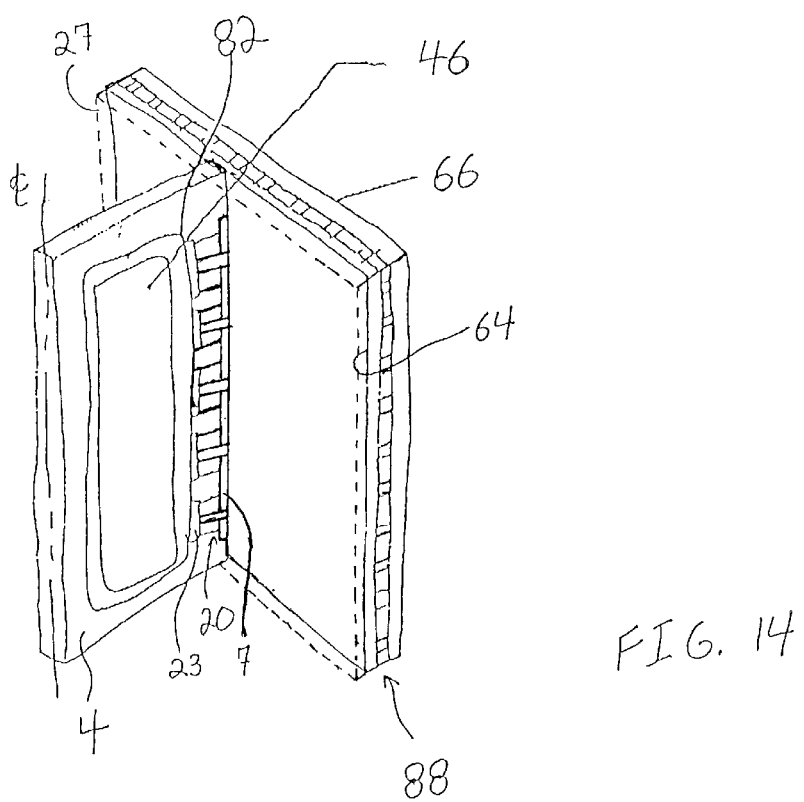

QUICK CHARGE BATTERY WITH THERMAL MANAGEMENT

CROSS-REFERENCE TO RELATED APPLICATIONS

This application is a continuation in part of U.S. application Ser. No. 09/183,359 filed Oct. 30, 1998, now U.S. Pat. No. 6,057,050 which is a continuation in part of U.S. application Ser. No. 08/933,664 filed Sep. 17, 1997, now U.S. Pat. No. 5,871,859. U.S. application Ser. No. 08/933,664 claims the benefit of U.S. Provisional Application Ser. No. 60/046,027 filed May 9, 1997.

BACKGROUND OF THE INVENTION

The present invention relates in general to a thermal management device for use with a battery. In particular the present invention relates to a cooling and heating device to effectively cool the battery during rapid charging as well as heat the battery during colder periods.

There have been numerous attempts and initiatives established for next generation land based vehicles. Some programs have set goals for vehicle mileage of 80 miles/gal and greatly reduced vehicle emissions based on today's standards. Federal and local governments have placed limits on emissions as well as standards for fuel consumption. Even with recovery of regenerative braking energy, a hybrid electric/internal combustion vehicle will be pressed to meet these goals.

Hybrid, all-Electric and internal combustion types of vehicles need a means to store energy on board. For the present, the means of choice are lead-acid batteries, with the hybrid electric vehicle having auxiliary power supplied by a small internal combustion engine. The technology of leadacid batteries is well known in the art and is therefore the battery of choice based upon economics, availability and reliability.

One of the main drawbacks to lead-acid batteries is internal heat buildup as a natural consequence of the discharge process as well as $I^2R$ losses during discharge and high rates of charging. This limits the recharging rate of the battery for an electric vehicle, which has a limited range of about 80 miles. To become practical, a quick turnaround on recharge is needed. One of the factors preventing this advancement is heat build-up during quick recharge.

In a hybrid electric vehicle application the auxiliary power unit provides a continuous charge to the battery energy storage system. As such, heat generation in the lead-acid battery is a constant problem that must be addressed to reduce thermal damage to the batteries.

There are many U.S. patents that disclose various attempts aimed at cooling the battery during charging. Pat. No. 4,007,315 discloses liquid coolant tubes disposed in the electrolyte above the plates of the battery attempting to remove the heat generated in the battery. U.S. Pat. No. 5,569,552 discloses a double-walled battery in which to circulate liquid in an attempt to cool the battery. U.S. Pat. Nos. 5,623,195 and 5,121,047 disclose charging schemes, which attempt to limit or reduce the effect of the thermal build-up in the cells during charging. Although these charging schemes are effective in lowering the thermal build-up in batteries during a charge, they disadvantageously prolong the charging cycle.

None of the aforementioned prior art designs are aimed at the heart of the cell of a battery where the thermal energy is produced. What is needed is a thermal management device in batteries that will better manage the heat build-up in the hybrid electric vehicle as well as allowing for a much quicker charge in the all-electric vehicle, reducing the heating problem significantly in the battery energy storage units of these vehicles. It has been estimated that raising the average battery operating temperature by 10° C. shortens the lifetime of the battery by half. Therefore, it is of paramount importance that the temperature of the battery, and hence the amount of thermal energy that is produced in the battery, be managed accordingly.

SUMMARY OF THE INVENTION

The above discussed and other drawbacks and deficiencies of the prior art are overcome or alleviated by the quick charge battery with thermal management of the present invention.

The operation of the cooling system in one embodiment of the present invention utilizes thermoelectric cooling within the interior of the battery, as well as the exterior surfaces of the battery. The heat generated in the battery due to charging operations can be removed without creating problems in the operation thereof, while increasing the useful lifetime of the battery. In addition, with the thermoelectric cooler (also known as a thermoelectric generator) disposed within the battery it is possible to reverse current flow through the thermoelectric generator, thereby heating the battery under certain circumstances. The invention is therefore applicable to batteries of any type and in any usage where temperature control of the battery interior and/or exterior is desired. Microcoolers can be used in place of thermoelectric coolers or in addition to thermoelectric coolers.

Heat pipes may be used in place of thermoelectric cooling or in addition to thermoelectric cooling. The heat pipe comprises a flat plate heat pipe or thin flat plate heat pipe where electrolyte flows through the heat plate is not desired. In situations where electrolyte movement is desired, the heat pipe comprises an array or grid of smaller heat pipes or a heat pipe having a loop or other open shape.

A heat pipe may be sandwiched in thermal contact with a standard thermoelectric generator to form a cooling module. Preferably, the heat pipe is sandwiched between a pair of standard thermoelectric generators to form a cooling module. A heat pipe may be sandwiched in thermal contact with a microcooler to form an ultrathin cooling module. Preferably, the heat pipe is sandwiched between a pair of microcoolers to form an ultrathin cooling module.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several Figures:

FIG. 12 is a schematic and perspective view of a microcooler;

FIG. 13 is a schematic and perspective view of an embodiment of an ultrathin cooling module;

FIG. 14 is a perspective view of a portion of an embodiment of the invention with the battery case in phantom, showing a cooling module external to the battery case and a cooling module cold plate internal to the battery;

DETAILED DESCRIPTION OF THE PREFERRED EMBODIMENTS

The disclosures of U.S. application Ser. No. 09/183,359 filed Oct. 30, 1981, now U.S. Pat. No. 6,057,050 and U.S. application Ser. No. 08/933,664 filed Sep. 17, 1997, now U.S. Pat. No. 5,871,859, are hereby incorporated by reference.

Figure 1:
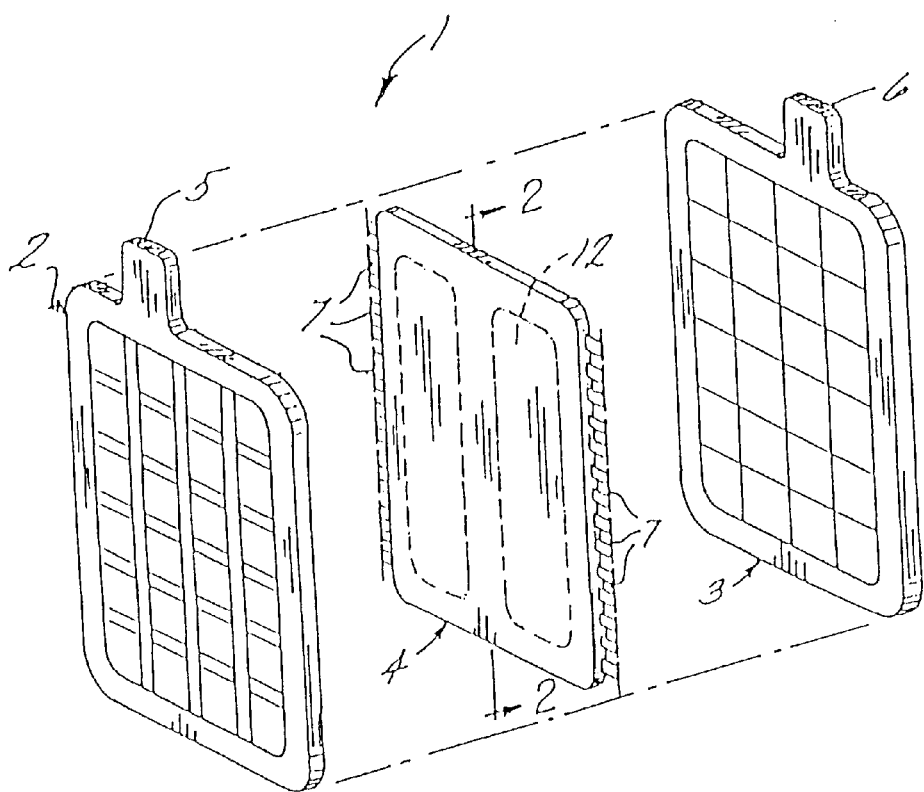
FIG. 1 is an exploded isometric view showing a partition incorporating the present invention.

Referring to FIG. 1 there is shown the basic two-plate system 1 of the present invention. The two plate system includes positive grid 2, negative grid 3 and partition 4. The positive grid includes positive terminal 5 and the negative grid includes negative terminal 6. The partition 4 is comprised of a microporous material and includes a thermoelectric generator of the present invention disposed therein. In an embodiment of the basic two plate system of the present invention microporous partition 4 is disposed within a battery casing (not shown) between positive grid 2 and negative grid 3 within an electrolytic solution (also not shown). The partition is comprised of microporous material to allow the free movement of ions between the two grids. Also shown in FIG. 1 are hot junction plates 7 of the thermoelectric generator.

Figure 2:
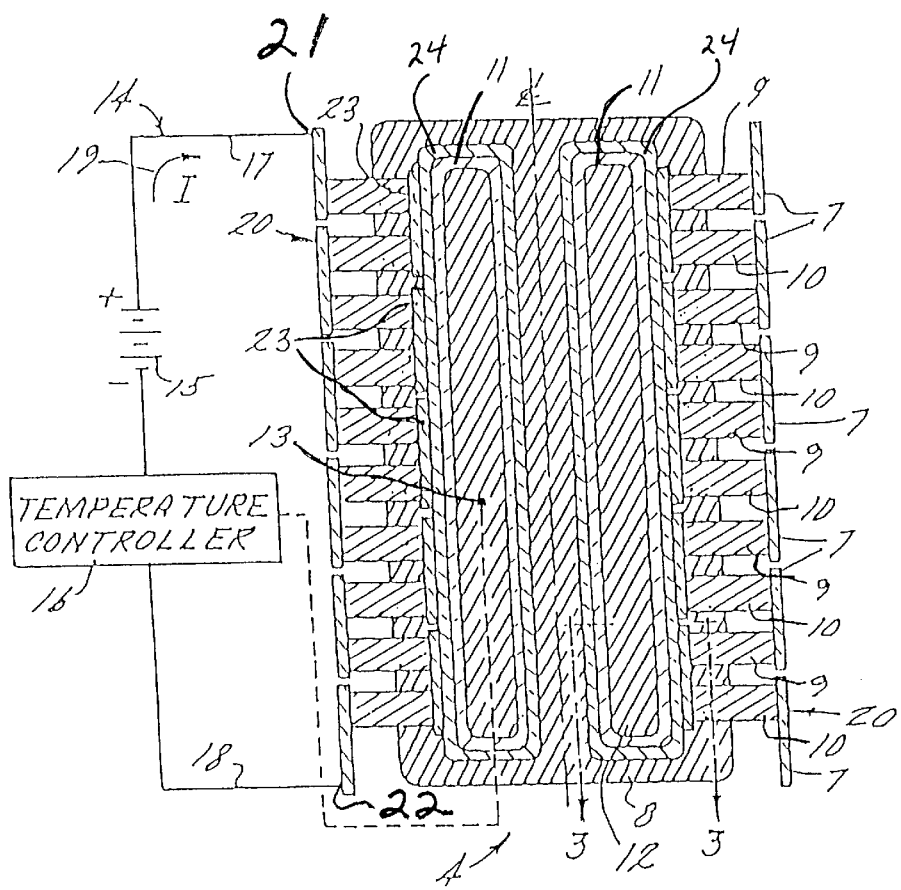
FIG. 2 is a schematic and sectional view taken along lines 2—2 of FIG. 1 showing the thermoelectric generator and temperature control circuit of the present invention.

Referring next to FIG. 2 there is shown a partial section view and schematic of the partition of the present invention as illustrated in FIG. 1. Partition 4 is comprised of microporous material 8, p-type semiconductor material 9, n-type semiconductor material 10, hot junction plates 7, cold plate 11, temperature sensor 13 mounted within slot 12, and temperature control circuit 14. Temperature control circuit 14 includes power source 15, temperature controller 16, and power leads 17, 18. In one embodiment of the present invention the temperature of a cell of the battery is determined by temperature sensor 13, either continuously or during a charging operation, and communicated to temperature controller 16. If the temperature within the cell is higher than a threshold temperature established within the controller, the power source sends a current 19 to thermoelectric generator 20 via power leads 17, 18 electrically connected to the thermoelectric generator at connections 21, 22. The current establishes a temperature difference between hot junction plate 7 and cold junction plate 23. With current 19 flowing in the direction shown in FIG. 2 the cold junction plates become lower in temperature than the hot junction plates. Cold junction plates 23 are disposed in a heat exchange relationship with cold plate 11 wherein the temperature of the cold plate is reduced. Microporous material 8 allows the electrolyte to pass through partition 4 where it comes into heat transfer contact with cold plate 11. The hot electrolyte is cooled by the cold plate, essentially a heat sink, until a lower threshold temperature is reached, at which time the temperature controller stops the current flow to the thermoelectric generator. The charging operation can continue at a rapid rate while the heat is transferred from the electrolyte to the cold plates. Although not shown in FIG. 2 temperature control circuit 14 also works to control thermoelectric generator 20 on the right hand side of the figure as shown.

Figure 3:
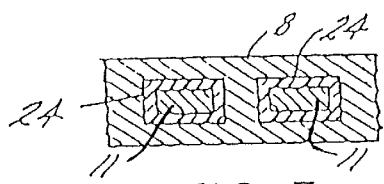
FIG. 3 is a sectional view taken along lines 3—3 in FIG. 2 showing a heat sink of the present invention.

The hot junction plates, cold junction plates and cold plates are advantageously comprised of a material with good heat transfer characteristics, such as exhibited by many metals. In addition, the hot junction plates and the cold junction plates are advantageously comprised of a material exhibiting good electrically conductive characteristics. The electrolyte within the battery is corrosive and as such the embodiment of the present invention depicted in FIG. 3 includes electrolyte resistant coating 24 encapsulating cold plate 11. Although not shown, the cold junction plates, the p-type material, the n-type material, the temperature sensor and other inventive components are all advantageously coated in a similar fashion to preclude attack of the component by the electrolyte. By way of example, commercially available ABS would be a suitable coating material.

Again with reference to FIG. 2 an embodiment of the present invention includes a battery which requires intermittent charging under various ambient temperature conditions. It is well known in the art that batteries operate most efficiently and reliably within a small band of temperatures. Likewise, if the ambient conditions surrounding the battery are too cold the internal resistance of a battery may be too high to allow the battery to operate efficiently. The battery in this particular embodiment would be electrically connected to a charging circuit as needed. If the temperature of a cell is higher than the predetermined threshold temperature the temperature controller would operate to cool the cell as described herein above. However, if the temperature of the cell is perceived to be lower than a predetermined threshold temperature the temperature controller functions to raise the temperature of the cell. In this mode of operation temperature controller 16 operates to switch the direction of current 19 to be opposite of that depicted in FIG. 2. With the current flowing in the opposite direction, thermoelectric generator 20 functions in an opposite manner to that described herein above. Namely, hot junction plate 7 becomes the cold junction plate and cold junction plate 23 becomes the hot junction plate. Heat is transferred to the cold plate wherein it is then transferred to the electrolyte to effect a temperature increase within the cell of the battery. Current is supplied via the temperature controller until the cell reaches a suitable predetermined temperature when charging, or a more efficient use of the battery can then be commenced. It is contemplated that this particular embodiment would be useful in transportation vehicles having internal combustion engines exposed to low ambient temperatures.

In another embodiment of the present invention it is contemplated that the charging circuit is also controlled by temperature control circuit 14, wherein the charging operation of the battery would not commence, or could be interrupted, until certain threshold temperature conditions were established by either heating or cooling the battery. In still another embodiment of the present invention it is contemplated that the temperature of the battery would be continuously monitored and maintained within a predetermined temperature range in an effort to maintain the battery within an optimum efficiency range and to prolong the life of the battery.

The battery cooling system may also comprise a heat pipe. A heat pipe is a heat transfer device comprising a sealed housing with an inner lining of a wicklike capillary material and a small amount of fluid in a partial vacuum. Heat is absorbed at one end of the heat pipe by vaporization of the fluid and is released at the other end of the heat pipe by condensation of the vapor. Heat pipes have a higher heat flux capability than many other materials including those conventionally used in battery construction. A heat pipe may comprise a number of configurations including, for example, flat plat heat pipes, grid heat pipes, shaped heat pipes and loop heat pipes. The heat pipe can also be flexible. The heat pipe may be used alone to transfer heat from the battery interior to a heat sink exterior to the battery. The heat pipe may be disposed, for example, within battery case walls, between grid plate pairs, between full cell partitions, between cell stack partitions or submerged in electrolyte between the battery positive and negative plates. The heat pipe may also be beneficially used in the above positions in combination with other devices such as a thermoelectric generator 20 or microcooler 62 to transfer heat away from the battery. Heat pipes can also be used to transfer heat to the interior of the battery from external sources.

Figure 2A:
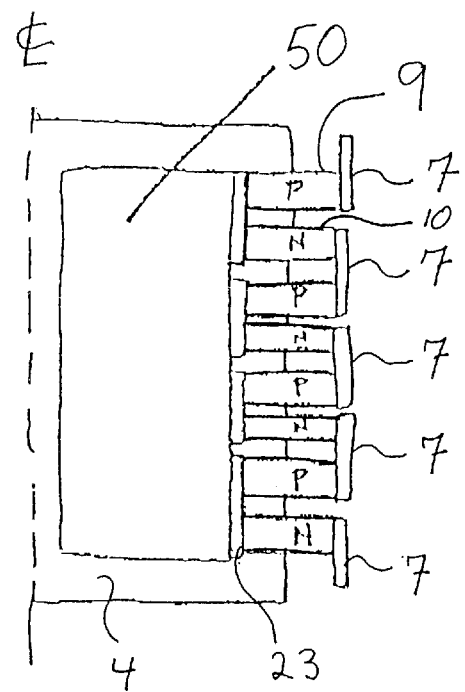
FIG. 2A is a view similar to a portion of FIG. 2 with a cold plate comprising a flat plate heat pipe.

Referring now to FIG. 2A there is shown one half of cell partition 4 for use in an embodiment of the present invention similar to FIG. 2. In this embodiment, a flat plate heat pipe or heat pipe thermal plate 50 is disposed in thermal contact with the cold junction plates 23 in place of the cold plate 11. The flat plate heat pipe 50 functions to transfer heat from the electrolyte to the cold junction plate 23. The flat plate heat pipe 50 can also function as a cooling partition and may be disposed between grid pairs and grid stacks. Since the flat plate heat pipe 50 is a solid shape, electrolyte flow is hindered in this embodiment. Thus, this embodiment is best suited for applications such as within battery case walls, between grid pair coolers or full cell partition coolers where electrolyte migration is not possible or required.

Figure 2B:
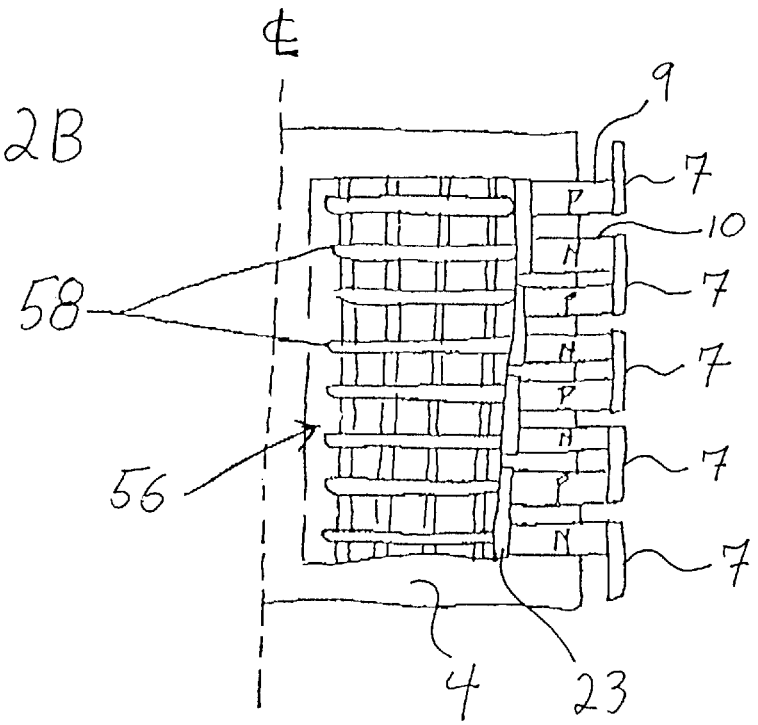
FIG. 2B is a view similar to a portion of FIG. 2 with a cold plate comprising a grid heat pipe comprised of an array of smaller heat-pipes.

Referring now to FIG. 2B there is shown one half of cell partition 4 for use in an embodiment of the present invention similar to FIG. 2. In this embodiment, an array or grid 56 of smaller heat pipes 58 is used in place of cold plate 11. The array 56 is disposed in thermal contact with the cold junction plates 23. Since the heat pipes 58 comprising the array 56 are separated, electrolyte flow through the array 56 is not hindered in this embodiment. The array 56 also functions as a cooling partition and may be submerged in electrolyte between the battery positive and negative plates or disposed between grid plate pairs or in cell stack partitions or used in applications such as between a positive and negative grid plate pair where electrolyte migration is desired.

Figure 4:
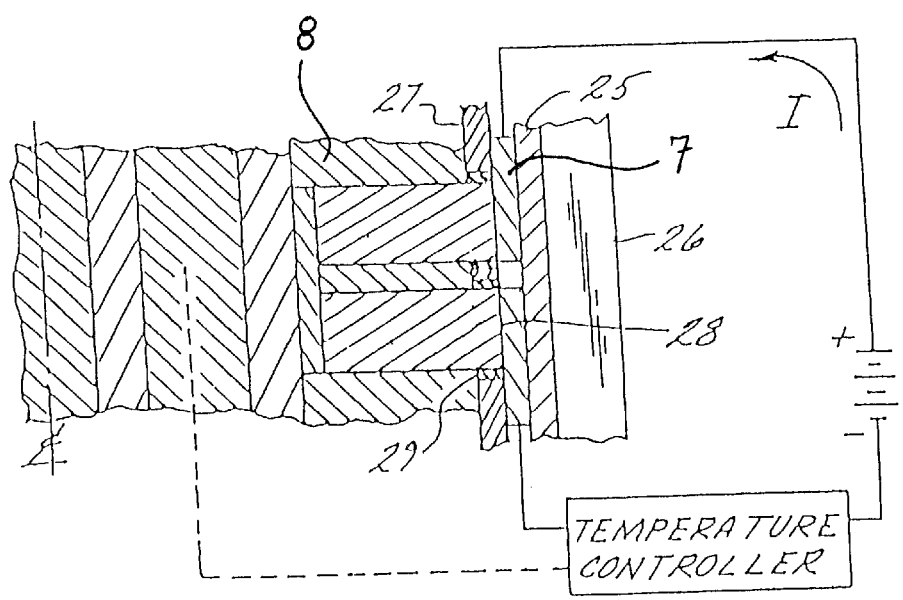
FIG. 4 is a partial schematic and partial sectional view showing the thermoelectric generator and temperature controlling circuit of the present invention.

Referring now to FIG. 4 there is shown a portion of cell partition 4 in an embodiment of the present invention. In this embodiment, hot plate 25 is disposed in contact with hot junction plate 7 and heat transfer fin 26. The hot plate and the heat transfer fin are positioned outside of battery case 27 and in heat transfer relationship with ambient air thereby increasing the heat transfer rate from the hot plate junction, the temperature difference between the hot plate junction and the cold plate junction, and ultimately increasing the efficiency of the thermoelectric generator. Cooling fin 26 could advantageously be placed in heat transfer relationship with air forced over the fin such as by a fan to increase the amount of heat transferred from the battery.

It is contemplated that an embodiment of the present invention would include only hot plate 25 without heat transfer fin 26 if additional heat transfer capability were not necessary. Also shown in FIG. 4 are openings 28 and seals 29 in battery case 27. The openings allow for the p–n materials to exit the battery case where they are connected to the hot junction plates. The seals work to retain the gases and electrolyte within the battery case. Also, shown in FIG. 4 is the encapsulation of the elements of the present invention within microporous electrolyte absorbent material 8.

Figure 5:
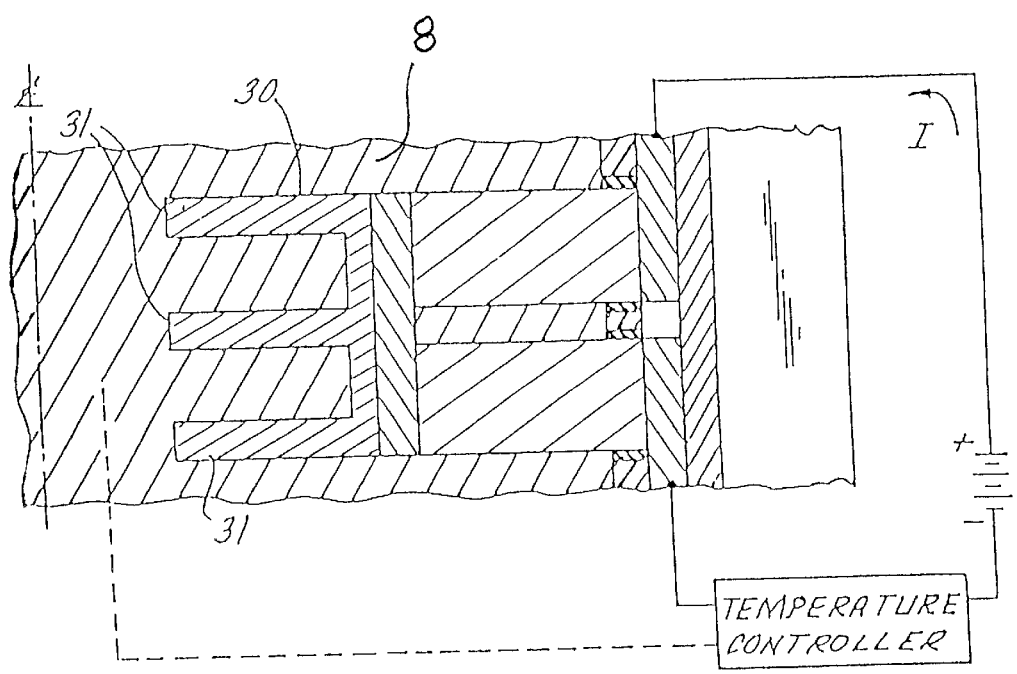
FIG. 5 is a partial schematic and partial sectional view showing the thermoelectric generator and temperature controlling circuit of the present invention.

Referring to FIG. 5 there is shown another embodiment of the cold plate 30 of the present invention. Cold plate 30 includes heat transfer fins 31 disposed within microporous material 8. The heat transfer fins increase the surface area in heat exchange relationship with the electrolyte and ultimately increase the overall heat transfer of the cold plate.

Figure 6:
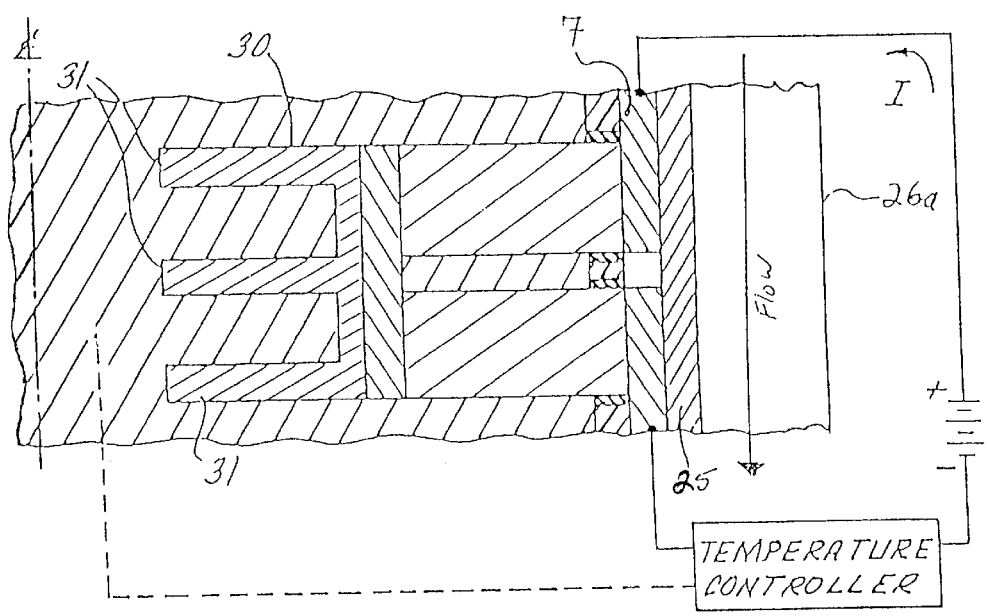
FIG. 6 is a partial schematic and partial sectional view similar to FIG. 5 showing cooling of the hot junction plate by a fluid heat exchanger.

Alternatively, as shown in FIG. 6, the hot plate 25 could be disposed in physical and thermal contact with a heat exchanger 26a. Cooling fluid, such as water, flowing through the heat exchanger would transfer heat away from the hot plate to increase the amount of heat transferred from the battery. The configurations shown are by way of example and do not limit the many various configurations of a cold plate contemplated by the present invention.

Figure 7:
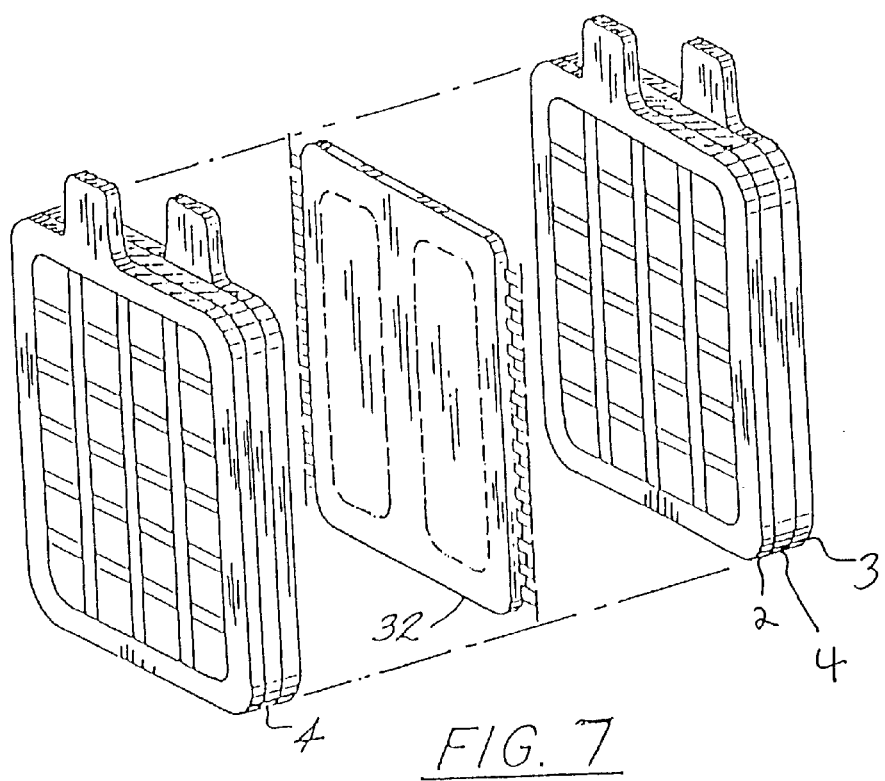
FIG. 7 is an exploded isometric view showing a cell separator incorporating the present invention.
Figure 8:
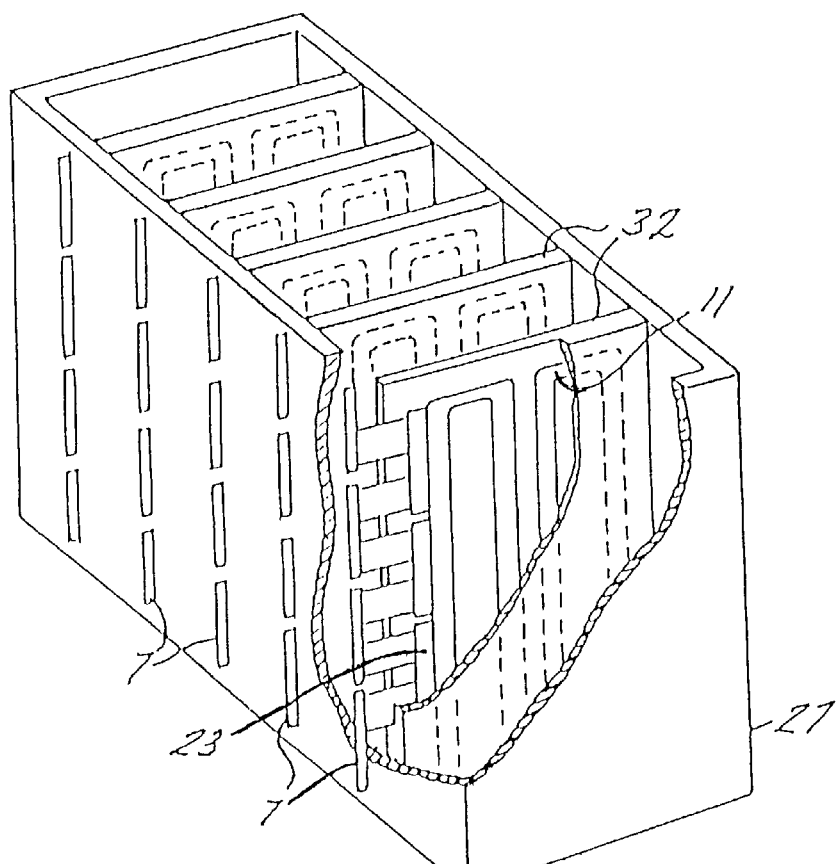
FIG. 8 is an isometric view of a battery case and partial sectional view of cell separators incorporating the present invention.

Referring to FIGS. 7 and 8 there is shown an embodiment of the present invention wherein the thermoelectric generator is disposed within cell separator 32. FIG. 7 illustrates positive plates 2 separated from negative plates 3 by partition 4. Each pair of positive and negative plates immersed in an electrolyte in ion exchange relationship defines a cell within a battery. The cells are separated from one another, with no ion exchange occurring between cells, by cell separator 32. FIG. 8 illustrates the placement of cell separators incorporating the thermoelectric generators of the present invention in battery case 27. Shown in the figure is a typical arrangement of a 12-volt lead-acid battery including five cell separators defining six cells. The cell separator 32 illustrated in the foreground of the figure is shown in partial cross section in order to expose the detail of the thermoelectric generator. The cell separators 32 are comprised of a nonporous material and contact battery case 27 in a gas-tight and fluid-tight connection to isolate each of the cells. An embodiment of this type, wherein the thermoelectric generators are disposed within the cell separators, functions similar to that of the embodiment where the thermoelectric generators are disposed in the aforementioned partitions. The basic difference is that the cell separators are non-porous and therefore there is no direct heat transfer between the cold plates and the electrolyte. The heat transfer occurs due to conduction heat transfer between the electrolyte and the cell separator material and then in turn between the cold plates and the non-porous cell separator material. An embodiment is contemplated where thermoelectric generators would be disposed only in a few of the cell separators when additional cooling capacity is not required.

Figure 9:
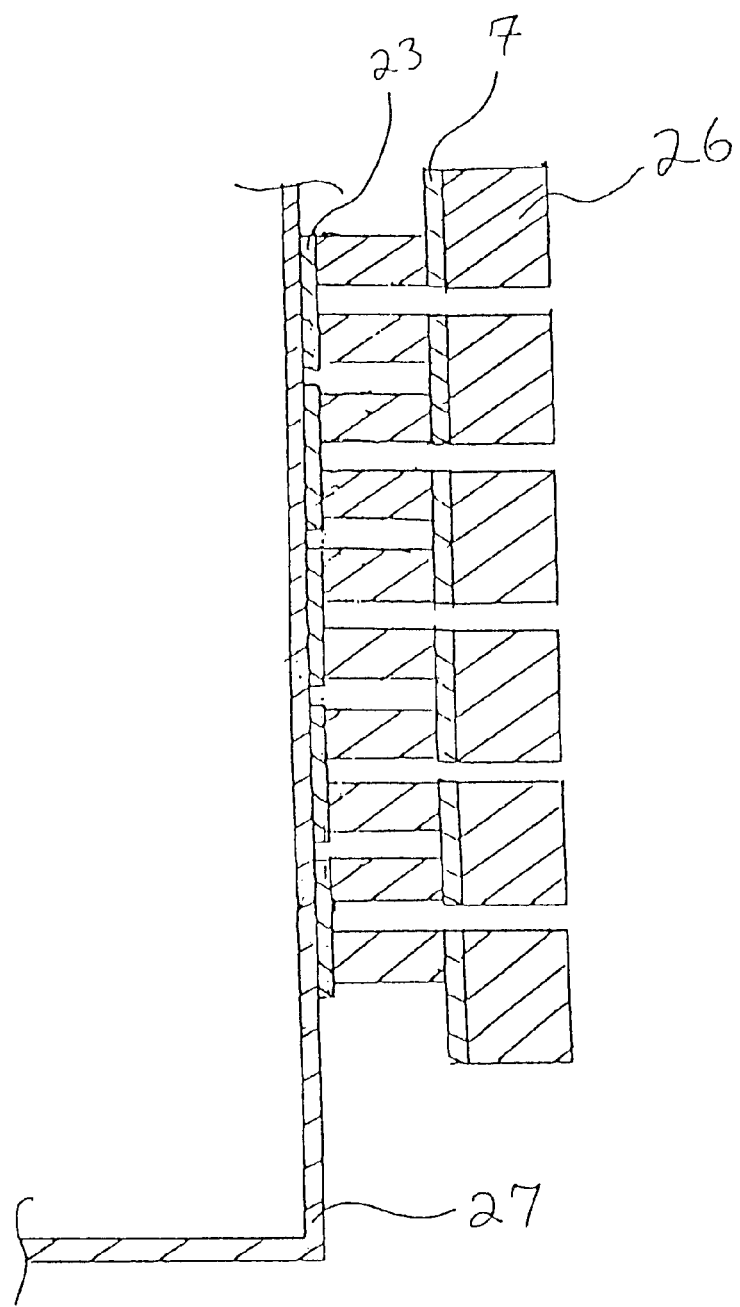
FIG. 9 is a schematic view of a battery incorporating an embodiment of the invention using cooling of the external battery case

Another embodiment, shown in FIG. 9, is possible where the thermoelectric generator is outside of the battery, with the cold junction plates 23 in a heat exchange relationship with the exterior of the battery case 27. In this embodiment the hot junction plates 7 are also external to the battery, and may be in a heat exchange relationship with a transfer fin 26 for air-cooling or other heat exchange device (not shown) for liquid cooling. In practice, the thermoelectric generator could be sandwiched between two protective layers of, for example Mylar, with one protective layer attached to the battery case and the cold junction plate in thermal contact with the case through that layer. The hot junction plate would be in thermal contact with the opposite layer, and transfer heat therethrough to a fin or other heat exchange device. Although not shown in the figures, an embodiment of the present invention is contemplated where the thermoelectric generator is disposed within the wall of the battery case in much the same manner as the embodiment disposed within the cell separator. There is also contemplated an embodiment of the present invention including a combination of thermoelectric generators disposed in some or all of the cell separators, partitions, walls and exterior of the battery case.

Figure 10:
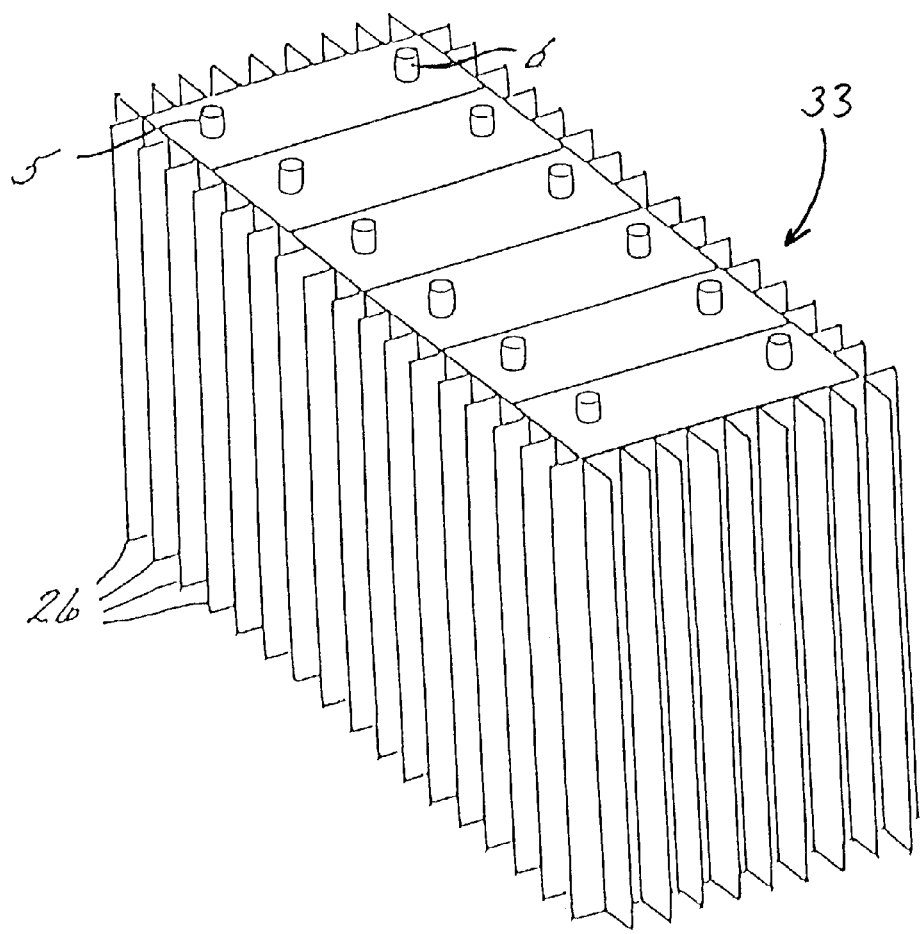
FIG. 10 is an isometric view of a battery showing external heat exchanger fins.

Referring to FIG. 10 there is shown such an embodiment of a battery 33 including external heat transfer fins 26. In other certain embodiments external heat transfer fins 26 would be located externally consistent with the internal placement of thermoelectric generators.

Also, illustrated in FIG. 10 are separate positive terminals 5 and negative terminals 6. In this particular embodiment the charging operation is carried out on a cell-by-cell basis. Each cell includes a temperature sensing device and a temperature control circuit. The temperature of each cell is separately controlled as it is charged so that no one cell is outside of the predetermined temperature limits and such that no cell is undercharged or overcharged.

Figure 11:
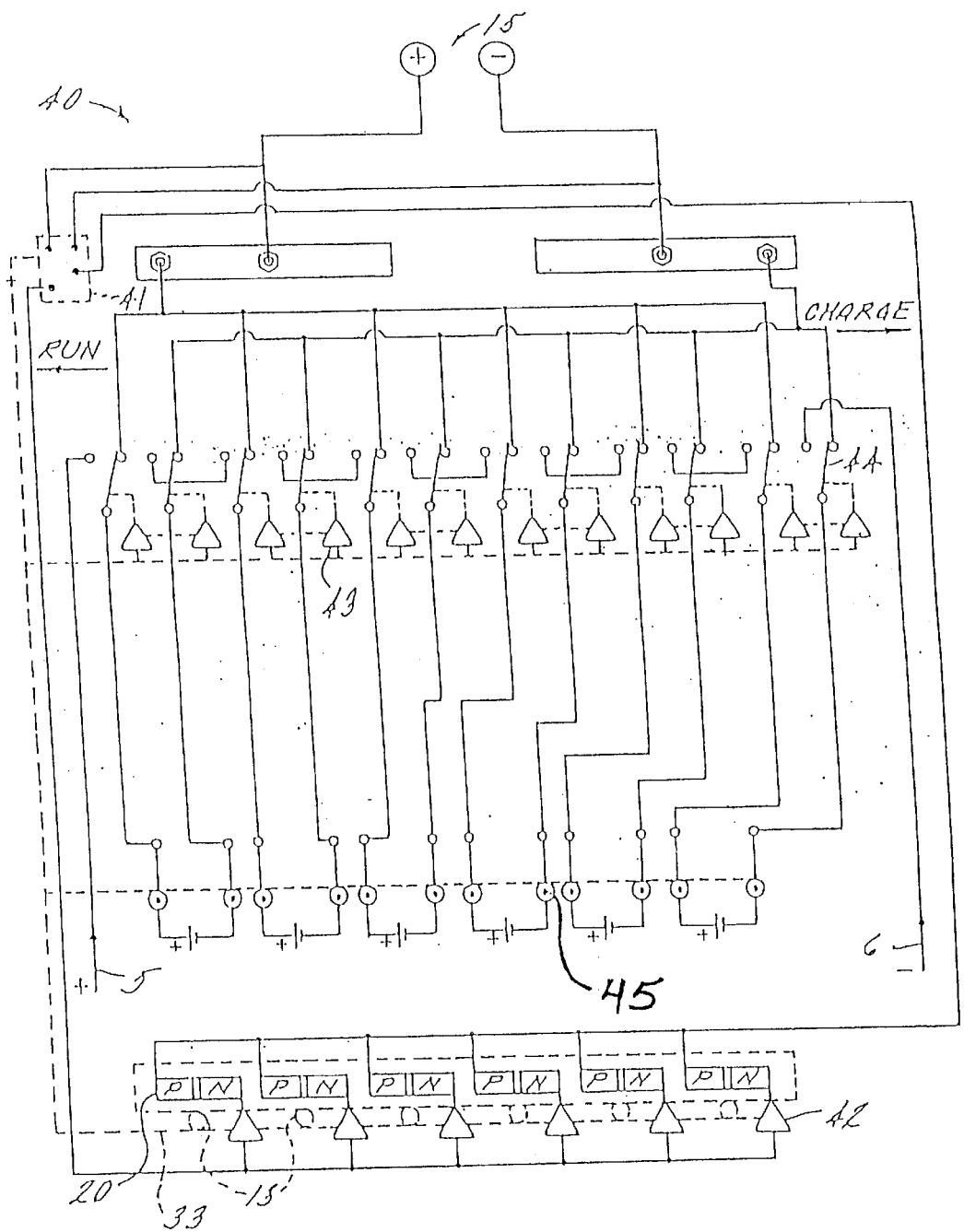
FIG. 11 is a schematic diagram showing a battery incorporating the charging and temperature control system of the present invention.

Referring now to FIG. 11 there is shown a schematic diagram of an embodiment of quick charging battery system 40 of the present invention. The quick charging battery system includes battery charge and temperature controller 41, thermoelectric generator controller 42, battery contact controller 43, switch 44, and battery charge sensors 45. The circuit illustrated shows battery contact controllers 43 with switches 44 in the charge position. In operation, battery charge sensors monitor the voltage of the battery and transmit a signal to battery charge and temperature controller 41. When the voltage reaches a predetermined low threshold the battery charge and temperature controller check the temperature of each cell and transmits power to each of the thermoelectric generator controllers to adjust the temperature of the cell within predetermined limits. Once the battery reaches a temperature within the acceptable range the contact controllers position the switches in the charge position and charging current is carried to the individual cells from power source 15. The temperature of the battery is maintained within limits during the charging operation. The charge sensors monitor the voltage levels within each cell and when the level of charge reaches a predetermined level the charge and temperature controller transmits a signal to the battery contact controller for that individual cell to reposition the switch in the opposite, run, position. If, during the charging of an individual cell, the temperature increase is too high the battery charge and the temperature controller stops charging that individual cell until the thermoelectric generator is capable of lowering its temperature sufficiently. The sequence of monitoring charge and temperature and supplying a current to the charging network and to the thermoelectric generators continues on an ongoing basis until the system is turned off. An embodiment of the present invention is also contemplated wherein the charging network is operable to charge the battery while the battery is simultaneously in electrical contact with a load.

Referring now to FIG. 12 a thin film microgenerator or microcooler 62 is shown. The microcooler 62 is a miniaturized version of a thermoelectric generator. The microcooler 62 can be on the order of 50 to 500 microns thick. The small size of the thin film microcoolers expands options for placement. The microcooler 62 includes a cold side 64 and a hot side 66 when electrical current is provided in a first flow direction. The microcooler cold side 64 provides cooling such as by thermal contact with the battery case 27, electrolyte or a surface internal to the battery. Heat removal from the microcooler hot side 66 can be increased if the hot side 66 is in thermal contact with a heat transfer augmentation device (68 shown in FIG. 13B). The microcooler 62 is a thermoelectric generator; therefore electrical current flow can be reversed to reverse the hot and cold sides and provide battery heating.

Referring now to FIG. 13 an ultra thin cooling module 80 is shown. The ultra thin cooling module 80 is preferably comprised of a heat pipe sandwiched between, and in thermal contact with, the hot sides 66 of a spaced pair of microcoolers 62. In the embodiment shown in FIG. 13, the heat plate is a flat plate heat plate 50. Preferably, the cold side 64 of each of the microcoolers 62 is in thermal contact with the interior of the battery, such as with one of the battery negative and positive plates. The heat pipe edge 82 extends through the battery case 27. The cooling module 80 functions to transfer thermal energy from the interior of the battery to a sink external to the battery. Naturally, the heat pipe 50 would be sealed to the battery case to prevent electrolyte leakage.

Figure 13A:
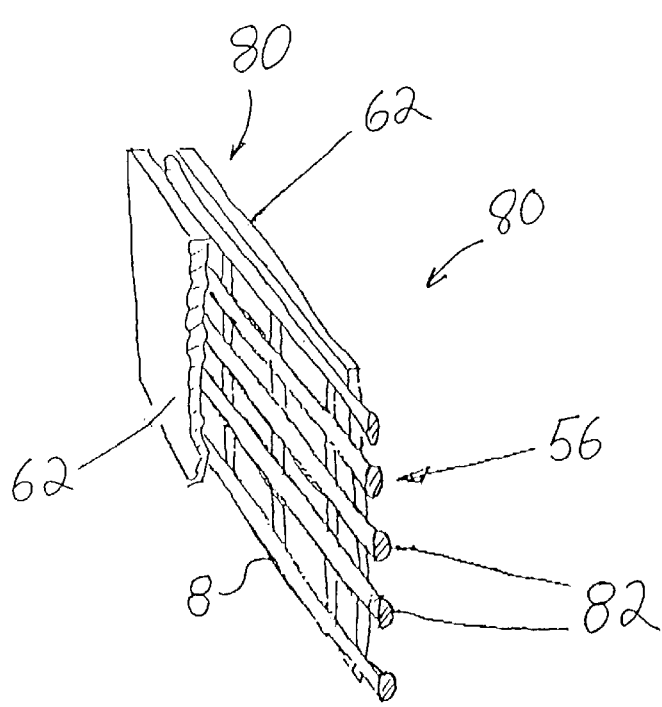
FIG. 13A is a schematic and perspective view, partly broken away, of a heat pipe array incorporated in an ultrathin cooling module.

The ultrathin cooling module 80 may beneficially comprise an array heat pipe 56 preferably sandwiched between, and in thermal contact with, the hot sides 66 of a spaced pair of microcoolers 62 as shown in FIG. 13A.

Figure 13B:
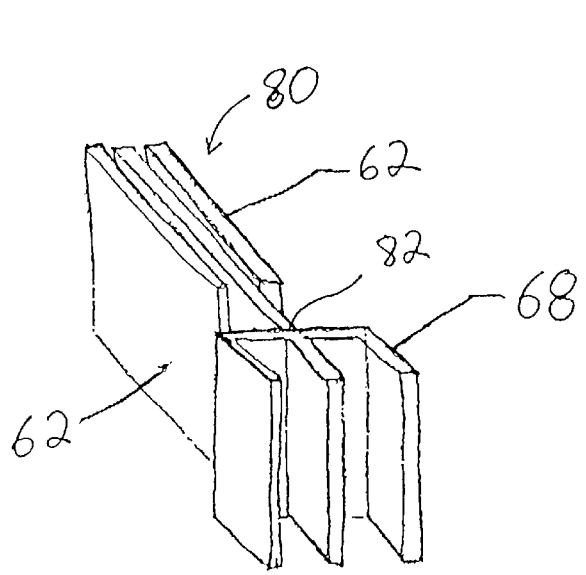
FIG. 13B is a schematic and perspective view of an ultrathin cooling module having a heat transfer augmentation device.

As shown in FIG. 13B, the heat pipe edge 82 may be in thermal contact with a heat transfer augmentation device 68 preferably disposed external to the battery case (27 but not shown in FIG. 13B). The heat transfer augmentation device 68 functions to increase dissipation of thermal energy from the heat pipe edge 82 to the environment outside the battery. The heat transfer augmentation device 68 shown in FIG. 13B uses fins to dissipate heat to air flowing over the fins. The airflow may be generated by natural convection or induced. The heat transfer augmentation device 68 may assume various forms which include, for example, fins, air flow either natural or forced, liquid cooling and additional thermoelectric coolers cascaded to increase the cooling effect on the battery interior.

In the embodiment shown in FIG. 14, the heat pipe edge 82 is in thermal contact with a plurality of thermoelectric generators. The thermoelectric generators 20 are in thermal contact with an external thermoelectric cooler 88 to remove heat from the heat pipe and away from the battery. The heat pipe may be of any type. Alternatively, the heat pipe may be replaced with an ultrathin cooling module 80. Naturally, other combinations of disclosed components suitable for cooling of a battery would occur to those skilled in the art, and all such combinations are fully encompassed by the invention.

Figure 15:
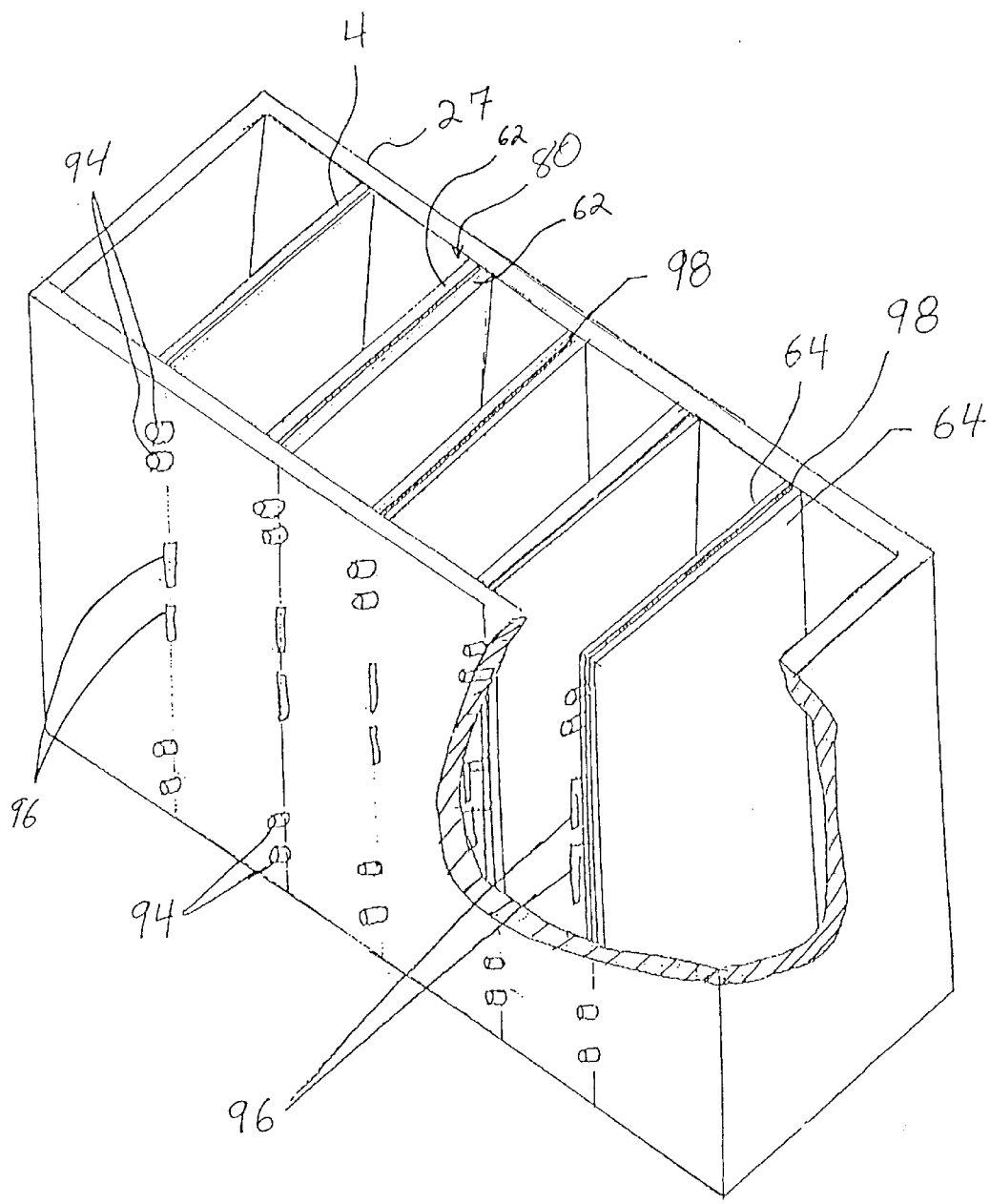
FIG. 15 is a perspective view, partly broken away, of a battery incorporating heat pipes and ultrathin cooling modules.

FIG. 15 illustrates an embodiment of the invention wherein battery cell partitions 4 comprise ultrathin cooling modules 80. Each cooling module 80 has portions of heat pipes and electrical connections for the thermoelectric coolers projecting from the battery case 27. The exposed portions comprise external heat pipe connections 94 and external thermoelectric cooler electrical connections 96. A heat pipe is hermetically sealed, therefore, if a portion of a looped or similarly shaped heat pipe 98 is used; each heat pipe 98 will have a pair of heat pipe connections 94 projecting from the battery case 27. While not shown, ultrathin cooling modules 80 may be disposed in some or all of the external battery case walls to increase battery cooling. Additionally, microcoolers and cooling modules have uses removed from the battery embodiment. The microcoolers can be controlled in a manner similar to that described in FIG. 11.

Figure 15A:
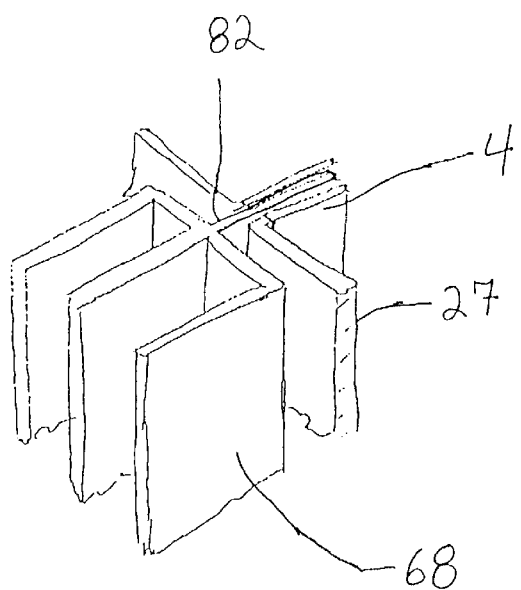
FIG. 15A is a perspective view of a portion of a battery with a heat pipe thermally connected to a heat transfer augmentation device external to the battery case.

A heat transfer augmentation device 68 can be disposed in thermal contact with the heat pipe edge 82 as shown in FIG. 15A. In this embodiment, the heat pipe removes thermal energy from the battery interior to the battery exterior and the heat transfer augmentation device 68 aids in dissipation of this thermal energy to the environment exterior of the battery.

Figure 15B:
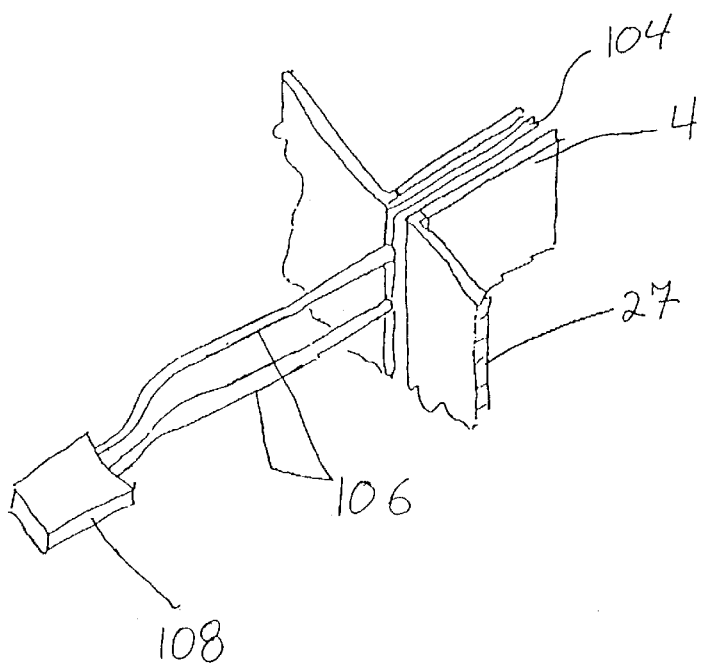
FIG. 15B is a schematic view similar to FIG. 15A of a flexible heat pipe with a remote end external to the battery case.

As shown in FIG. 15B, the cooling module may comprise a flexible heat pipe 104. The flexible heat pipe 104 includes connections 106 projecting externally to the battery case 27. The external connections 106 terminate at the flexible heat pipe remote end 108. The remote end 108 may be in thermal contact with a heat transfer augmentation device (not shown). The flexible heat pipe 104 may be replaced with a looped or shaped heat pipe 98.

The quick charge battery system of the present invention is advantageously used in the internal combustion engine vehicles of today in order to prolong battery life. Currently the lead-acid batteries used in automobiles are constantly being charged by the alternator and are therefore continuously being subjected to high temperatures from both the inherent process of being recharged and the hot ambient environment. An embodiment of the present invention includes a scheme whereby energy that is supplied by the alternator is used to continuously cool the battery. On extremely cold days, the battery can be brought up to operating temperature quickly by the thermoelectric generator, then cooled or heated as needed.

Thermal management of the battery either during charging or during usage is not unique to lead-acid batteries and the present invention is not limited to usage therein. The problem of heat build-up is encountered in many electrochemical batteries. Therefore, the utilization of the thermoelectric heater/cooler in the cell partitions or battery walls to better control the operating temperature of the battery is also a great enhancement to the state of the art of battery thermal management. This would include the use of the thermal management system in battery charges where the external wall of the individual battery cells becomes hot from charging.

The thermal management system of the present invention can also be applied to other chemical energy conversion means such as fuel cell batteries. For example, in an $H_2/O_2$ fuel cell, dehydration of cell membranes due to heat generation from the electrochemical reactions takes place. This dehydration causes cell performance to deteriorate. But utilization of the thermoelectric cooler and thermal management system in the construction of the fuel cell battery can control the heat generation in the cell and hence improve cell performance and extend the fuel cell life.

The drawings of the thermoelectric generator show the basic p-material and n-material junctions that are used for the device. However, the state of the art is such that variations of the basic p–n junctions can include cascading or staging of the generators to improve the efficiency and the effectiveness of the thermal energy that is available. This would also include staging the p-material and the n-material to improve the overall figure of merit.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A thermal energy management system comprising:
   energy conversion means for converting chemical energy to electrical energy;
   a heat pipe device substantially disposed in said energy conversion means;
   thermoelectric cooler means for generating temperature differential disposed in heat exchange relationship with the heat pipe; and
   means for heat transfer in heat exchange relationship with said thermoelectric cooler means.

2. The system of claim 1, wherein said energy conversion means comprises a case and said heat pipe device is enclosed completely within said case.

3. The system of claim 1, wherein said energy conversion means comprises a case, said heat pipe device is enclosed completely within said case, said means for heat transfer is a thermoelectric cooler having a first and a second junction surface and said first junction surface is in heat exchange relationship with said case.

4. The system of claim 1, wherein said heat pipe device is an array of heat pipes.

5. The system of claim 1, wherein said heat pipe device comprises a first surface disposed in heat exchange relationship with at least one of the group consisting of a thermoelectric cooler, an electrolyte, an energy conversion means case, a grid pair and a cell partition.

6. The system of claim 1, wherein said means for heat transfer is heat transfer augmentation means for increasing dissipation of thermal energy.

7. The system of claim 1, wherein said means for heat transfer comprises a spaced pair of microcoolers and said heat pipe device is disposed between said spaced pair of microcoolers.

8. The system of claim 1, further comprising heat transfer augmentation means for increasing dissipation of thermal energy, said heat transfer augmentation means in heat exchange relationship with said heat pipe device.

9. The system of claim 1, further comprising heat transfer augmentation means external to a case for said energy conversion means for increasing dissipation of thermal energy, said heat transfer augmentation means in heat exchange relationship with said heat pipe device.

10. The system of claim 1, wherein said heat transfer means comprises a power source in electrical contact with said thermoelectric cooler means, wherein when said power source supplies electrical current to said thermoelectric cooler means in a first direction, heat is transferred from said heat pipe device to said thermoelectric cooler means and when said power source supplies electrical current to said thermoelectric cooler means in a second direction, heat is transferred from said thermoelectric cooler means to said heat pipe device.

11. The system of claim 1, wherein said energy conversion means comprises a case; said heat pipe device comprises a heat pipe device connection projecting from said case and said thermoelectric cooler means has an electrical contact projecting from said case.

12. The system of claim 1, wherein said energy conversion means comprises a case; said heat pipe device comprises a heat pipe device edge projecting from said case and said means for heat transfer comprises heat transfer augmentation means in heat exchange relationship with said heat pipe device edge.

13. The system of claim 1, wherein said energy conversion means is one of a battery or a fuel cell.

* * * * *